US011347904B2

(12) United States Patent
Iorio et al.

(10) Patent No.: US 11,347,904 B2
(45) Date of Patent: May 31, 2022

(54) TECHNIQUES FOR MODELING BEHAVIORS OF SYSTEMS VIA TRANSFORMATIONS OF AUTHORITATIVE MODELS

(71) Applicant: AUTODESK, INC., San Rafael, CA (US)

(72) Inventors: Francesco Iorio, Toronto (CA); Ali Baradaran Hashemi, Toronto (CA)

(73) Assignee: AUTODESK, INC., San Rafael, CA (US)

(*) Notice: Subject to any disclaimer, the term of this patent is extended or adjusted under 35 U.S.C. 154(b) by 1069 days.

(21) Appl. No.: 15/349,891

(22) Filed: Nov. 11, 2016

(65) Prior Publication Data

US 2017/0154139 A1 Jun. 1, 2017

Related U.S. Application Data

(60) Provisional application No. 62/261,238, filed on Nov. 30, 2015.

(51) Int. Cl.
*G06F 30/20* (2020.01)
*G06N 20/10* (2019.01)
*G06N 20/00* (2019.01)

(52) U.S. Cl.
CPC ............ *G06F 30/20* (2020.01); *G06N 20/00* (2019.01); *G06N 20/10* (2019.01)

(58) Field of Classification Search
CPC ... G06F 17/5009; G06F 17/50; G06N 99/005; G06N 99/00
See application file for complete search history.

(56) References Cited

U.S. PATENT DOCUMENTS 5,704,012 A * 12/1997 Bigus ................... G06F 9/5011
706/19
5,872,958 A * 2/1999 Worthington ........... G06F 30/20
703/13

(Continued)

OTHER PUBLICATIONS

Tikir, et al. "Genetic Algorithms Approach to Modeling the Performance of Memory-bound Computations". Proceedings of the 2007 ACM/IEEE conference on Supercomputing. ACM, Nov. 10-16, 2007 (Year: 2007).*
Risau-Gusman, Sebastian, and Mirta B. Gordon. "Hierarchical learning in polynomial support vector machines." Machine learning 46.1-3 (2002): 53-70. (Year: 2002).*

(Continued)

*Primary Examiner* — Kamran Afshar
*Assistant Examiner* — Randall K. Baldwin
(74) *Attorney, Agent, or Firm* — Artegis Law Group, LLP (57) ABSTRACT

In one embodiment, a model generator generates a new model for a behavior of a system based on an existing, authoritative model. First, a mapping generator generates a mapping model that maps authoritative values obtained via the authoritative model to measured values that represent the behavior of the system. Subsequently, the model generator creates the new model based on the authoritative model and the mapping model. In this fashion, the mapping model indirectly transforms the authoritative model to the new model based on the measured values. Advantageously, the authoritative model enables the model generator to increase a rate of accuracy improvement experienced while developing the new model compared to a rate of accuracy improvement that would be experienced were the new model to be generated based on conventional modeling techniques. In particular, for a given sampling budget, the model generator improves the accuracy of the new model.

20 Claims, 4 Drawing Sheets

(56) References Cited

U.S. PATENT DOCUMENTS

| | | | | |
|---|---|---|---|---|
| 6,453,265 | B1* | 9/2002 | Dekhil | G06N 3/126 |
| | | | | 702/181 |
| 2004/0044509 | A1* | 3/2004 | Dernier | G06F 30/36 |
| | | | | 703/14 |
| 2009/0144042 | A1* | 6/2009 | Lorenz | G06F 30/20 |
| | | | | 703/14 |
| 2009/0228846 | A1* | 9/2009 | McConaghy | G06F 30/36 |
| | | | | 716/106 |
| 2014/0122486 | A1* | 5/2014 | Simard | G06F 16/258 |
| | | | | 707/737 |
| 2014/0149331 | A1 | 5/2014 | Iorio | |
| 2015/0339572 | A1* | 11/2015 | Achin | G06N 5/02 |
| | | | | 706/46 |
| 2016/0104076 | A1* | 4/2016 | Maheshwari | G06N 20/00 |
| | | | | 706/12 |
| 2016/0147920 | A1* | 5/2016 | Goulkhah | G06F 11/261 |
| | | | | 703/21 |
| 2016/0357889 | A1* | 12/2016 | Garg | G06F 30/30 |
| 2017/0147722 | A1* | 5/2017 | Greenwood | G16B 5/20 |

OTHER PUBLICATIONS

Vapnik, Vladimir, and Rauf Izmailov. "Learning using privileged information: similarity control and knowledge transfer." J. Mach. Learn. Res. 16.1 (Sep. 2015): 2023-2049. (Year: 2015).*

Nudd, Graham R., et al. "PACE—A toolset for the performance prediction of parallel and distributed systems." The International Journal of High Performance Computing Applications 14.3 (2000): 228-251. (Year: 2000).*

Balsamo, Simonetta, et al. "Model-based performance prediction in software development: A survey." IEEE Transactions on Software Engineering 30.5 (2004): 295-310. (Year: 2004).*

Dean, Daniel Joseph, Hiep Nguyen, and Xiaohui Gu. "Ubl: Unsupervised behavior learning for predicting performance anomalies in virtualized cloud systems." Proceedings of the 9th international conference on Autonomic computing. 2012: 191-200. (Year: 2012).*

Wang, Tong, Huijun Gao, and Jianbin Qiu. "A combined adaptive neural network and nonlinear model predictive control for multirate networked industrial process control." IEEE Transactions on Neural Networks and Learning Systems 27.2 (Apr. 16, 2015): 416-425. (Year: 2015).*

* cited by examiner

TECHNIQUES FOR MODELING BEHAVIORS OF SYSTEMS VIA TRANSFORMATIONS OF AUTHORITATIVE MODELS

CROSS-REFERENCE TO RELATED APPLICATIONS

This application claims the priority benefit of the U.S. Provisional Patent Application having Ser. No. 62/261,238 and filed on Nov. 30, 2015. The subject matter of this related application is hereby incorporated herein by reference.

BACKGROUND OF THE INVENTION

Field of the Invention

Embodiments of the present invention relate generally to computer processing and, more specifically, to techniques for modeling behaviors of systems via transformations of authoritative models.

Description of the Related Art

Making informed decisions involving a system oftentimes necessitates an understanding of different behaviors of the system with respect to various system parameters. For example, a user can select a processor and amount of physical memory for a computer system based on understanding a total throughput of the computer system for different combinations of processors and amounts of physical memory. In practice, various techniques may be used to obtain an understanding of the behavior of a given system. For example, for a simple system, the behavior with respect to a relatively small number of combinations of discrete system parameters can be measured in an exhaustive fashion, where, for each combination of system parameters, a parameterized system can be generated, and then the behavior of the parameterized system can be measured.

However, exhaustively measuring the behavior of complex systems, the behavior of a system with respect to a relatively large number of discrete system parameters, and/or the behavior of a system with respect to continuous system parameters can be highly impractical, if not impossible. To reduce the time and/or resources required to understand the behavior of a given system, oftentimes a model of the system is developed and tested. The model typically is designed to approximate the behavior of the system across various combinations of system parameters. The model is usually developed based on different samples. Each sample is the measured behavior of the system for a particular combination of system parameters. Any number and type of modeling techniques can be implemented to generate the model based on the samples. For instance, the model may be trained via Support Vector Machine (SVM) regression, Gaussian Process (GP) regression, or piecewise linear regression, to name a few.

In general, as the number of samples increases, the accuracy of the model increases. However, as the number of samples increases, the time and resources required to generate the model also increase. In practice, the number of samples obtained for a model is oftentimes constrained by a sampling budget that specifies the resources, such as time, that can be allocated to obtaining samples. Because the cost of obtaining samples for complex systems can be prohibitively expensive in terms of time and/or other resources, the sampling budget can severely curtail the number of samples obtained for a given system. As a result, the generated model may not provide the desired accuracy, and decisions that rely on the model may be sub-optimal.

For example, in one study, researchers generated samples for a performance model of a database engine (MySQL). To generate each sample, researchers configured the database engine to use a value for a storage cache between 128 Megabytes (MB) and 896 MB and a value for a database buffer pool between 32 MB and 256 MB. Subsequently, the researchers executed a benchmark, Transaction Processing Performance Council online transaction benchmark, to measure page access latency of the configured database engine. Researchers found that generating each sample took about 7.5 minutes. If the sampling budget were one hour, then the model would be trained based on only eight samples. The likelihood that the resulting model, trained using only eight samples, would reliably predict page access latencies across all possible sizes of the storage cache and database buffer pool would be very low.

As the foregoing illustrates, what is needed in the art are more effective techniques for modeling the behaviors of complex systems.

SUMMARY OF THE INVENTION

One embodiment of the present invention sets forth a computer-implemented method for generating a model for a behavior of a system. The method includes generating a first sample data that includes a first authoritative value that is obtained from an authoritative model based on a first combination of system parameters and a first measured value that represents the behavior of the system at the first combination of system parameters; training an untrained mapping model based on the first sample data to generate a partially trained mapping model; training the partially trained mapping model based on at least one other sample data to generate a trained mapping model, where the trained mapping model maps values obtained from the authoritative model to values that represent the behavior of the system at different combinations of system parameters; and generating the model for the behavior of the system based on the trained mapping model and the authoritative model, where the model estimates the behavior of the system for different combinations of system parameters.

One advantage of the disclosed techniques is that a rate of accuracy improvement experienced while developing the model for the behavior of the system exceeds a rate of accuracy improvement that would be experienced were a conventional model for the behavior to be generated based on conventional modeling techniques. In particular, if there is structural similarity between the behavior of the system and the authoritative model, the trained mapping model is typically less complex than the conventional model. As a result, for a given sampling budget, the mapping model and the associated model for the behavior of the system are more accurate than the conventional model.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
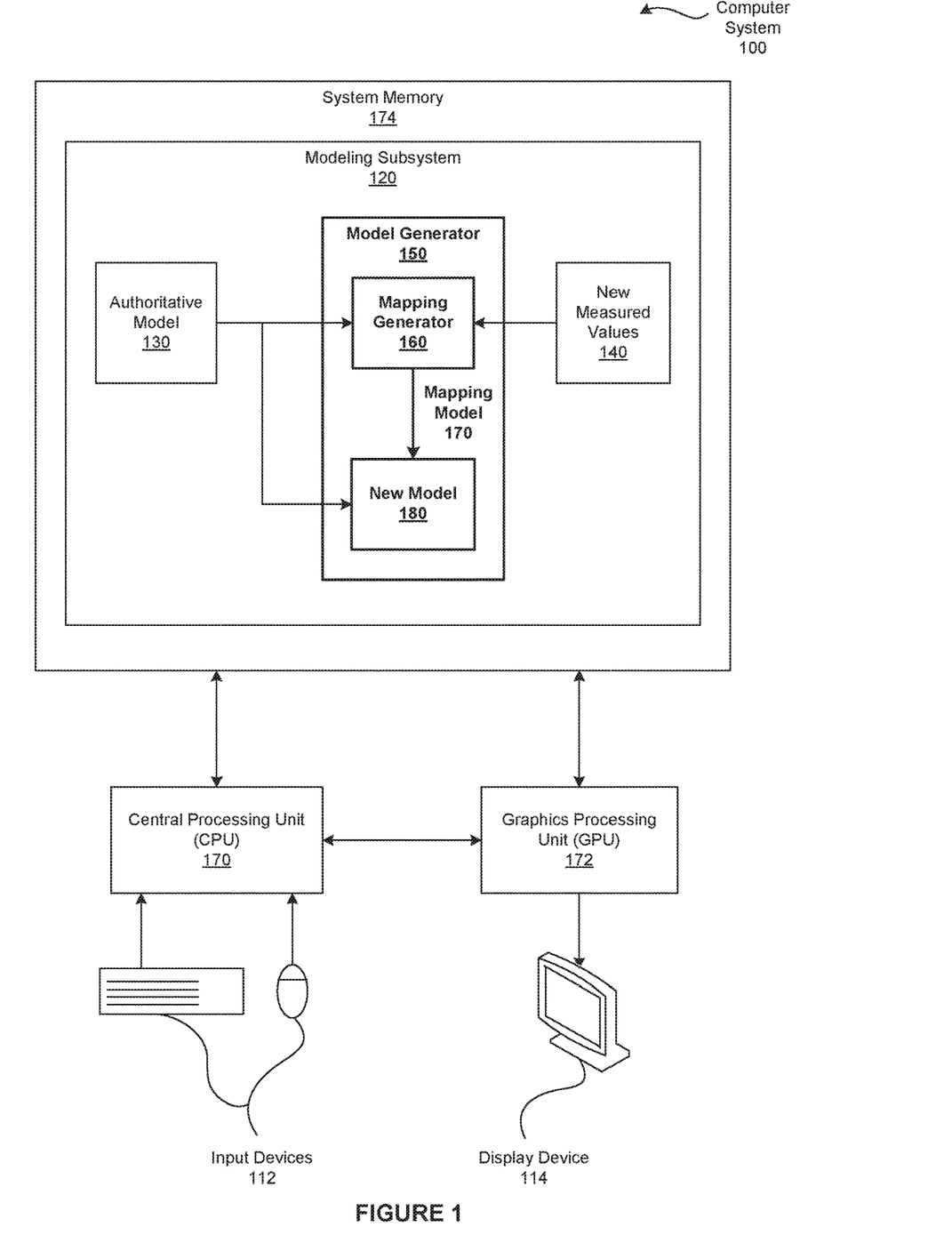
FIG. 1 is a conceptual illustration of a computer system configured to implement one or more aspects of the present invention.

FIG. 1 is a conceptual illustration of a computer system 100 configured to implement one or more aspects of the present invention. As shown, the computer system 100 includes, without limitation, a central processing unit (CPU) 170, input devices 112, a graphics processing unit (GPU) 172, a display device 114, and a system memory 174. For explanatory purposes, multiple instances of like objects are denoted with reference numbers identifying the object and parenthetical numbers identifying the instance where needed.

The CPU 170 receives user input from the input devices 112, such as a keyboard or a mouse. In operation, the CPU 170 is the master processor of the computer system 100, controlling and coordinating operations of other system components. In particular, the CPU 170 issues commands that control the operation of the GPU 172. The GPU 172 incorporates circuitry optimized for graphics and video processing, including, for example, video output circuitry. The GPU 172 delivers pixels to the display device 114 that may be any conventional cathode ray tube, liquid crystal display, light-emitting diode display, or the like.

In various embodiments, GPU 172 may be integrated with one or more of other elements of FIG. 1 to form a single system. For example, the GPU 172 may be integrated with the CPU 170 and other connection circuitry on a single chip to form a system on chip (SoC). In alternate embodiments, the CPU 170 and/or the GPU 172 may be replaced with any number of processors. Each of the processors may be any instruction execution system, apparatus, or device capable of executing instructions. For example, a processor could comprise a digital signal processor (DSP), a controller, a microcontroller, a state machine, or any combination thereof.

The system memory 174 stores content, such as software applications and data, for use by the CPU 170 and the GPU 172. The system memory 174 may be any type of memory capable of storing data and software applications, such as a random access memory (RAM), a read-only memory (ROM), an erasable programmable read-only memory (EPROM or Flash ROM), or any suitable combination of the foregoing. In some embodiments, a storage (not shown) may supplement or replace the memory 174. The storage may include any number and type of external memories that are accessible to the CPU 170 and/or the GPU 172. For example, and without limitation, the storage may include a Secure Digital Card, an external Flash memory, a portable compact disc read-only memory (CD-ROM), an optical storage device, a magnetic storage device, or any suitable combination of the foregoing.

It will be appreciated that the computer system 100 shown herein is illustrative and that variations and modifications are possible. The number of CPUs 170, the number of GPUs 172, the number of system memories 174, and the number of applications included in the system memory 174 may be modified as desired. Further, the connection topology between the various units in FIG. 1 may be modified as desired. In some embodiments, any combination of the CPU 170, the GPU 172, and the system memory 174 may be replaced with any type of distributed computer system or cloud computing environment, such as a public or a hybrid cloud.

In general, the computer system 100 is configured to facilitate understanding behaviors of systems with respect to system parameters via models. As referred to herein, a "model" is any technically feasible mechanism that determines a scalar or vector that predicts behavior(s) of a system based on value(s) for system parameter(s). In some embodiments, a model may consist of measured data corresponding to different combinations of the system parameters. In some embodiments, a model may comprise a function, where the system parameter(s) are input(s) to the function, and the behavior(s) are output(s) of the function. For example, a model could compute a total throughput of a computer system for different combinations of processors and amounts of physical memory. In another example, a model could predict a page access latency of a MySQL database engine for different combinations of storage caches and database buffer pools.

Generating models typically involves measuring the behavior of the system at selected combinations of the system parameters. For explanatory purposes, each combination of the system parameters is referred to as a "location." Further, behavior(s) measured at a location is referred to herein as a "sample" that is associated with the location. Any number and type of modeling techniques may be implemented to generate the model based on the samples. For instance, the model may be trained via Support Vector Machine (SVM) regression, Gaussian Process (GP) regression, or polynomial regression, to name a few.

In general, as the number of samples increases, the accuracy of the model increases. However, as the number of samples increases, the time and resources required to generate the model also increase. In practice, the number of samples obtained for a model is oftentimes constrained by a sampling budget that specifies the resources, such as time, that can be allocated to obtaining the samples. Because the cost of obtaining samples for complex systems can be prohibitively expensive in terms of time and/or other resources, the sampling budget can severely curtail the number of samples obtained for a given system. As a result, the generated model may not provide the desired accuracy, and decisions that rely on the model may be sub-optimal.

Increasing the Accuracy of a Model

To increase a rate of accuracy improvement experienced while generating models, the system memory 174 includes, without limitation, a modeling subsystem 120. The modeling subsystem 120 includes, without limitation, a model generator 150, an authoritative model 130, and new measured values 140. As referred to herein a "rate of accuracy improvement" is an overall rate of improvement in accuracy of a model as a modeling cost increases. Typically, an increase in the rate of accuracy improvement reflects an increase in an incremental improvement of a model for each additional sample. Accordingly, for a given sampling budget, the model generator 150 may generate a new model 180 for a behavior of a system with an accuracy that exceeds a model for the behavior of the system that is generated via conventional modeling techniques.

In operation, the model generator 150 generates the new model 180 based on both the authoritative model 130 and the new measured values 140. As referred to herein, the "authoritative model" 130 is any existing and validated model that predicts an "authoritative behavior" based on values for variable system parameters. For instance, an authoritative model may comprise an existing function or an existing set of values corresponding to different locations. The authoritative model 130 may be validated based on any criteria and in any technically feasible fashion. By contrast, as referred to herein, the new model 180 predicts a "new behavior" based on values for the variable system parameters that were previously unknown to the authoritative model.

As shown, the model generator 150 includes, without limitation, a mapping generator 160. The mapping generator 160 generates a mapping model 170 that maps authoritative values obtained from the authoritative model 130 to the new measured values 140 that represent the new behavior. Subsequently, the model generator 150 generates the new model 180 based on the mapping model 170 and the authoritative model 130. In this fashion, the model generator 150 indirectly transforms the authoritative model 130 to the new model 180 based on the new measured values 140.

For instance, suppose that the authoritative model 130 comprises an authoritative function, where the inputs of the authoritative function are values of the variable system parameters, and the output of the authoritative function is a value that represents the authoritative behavior. In such a scenario, the mapping generator 160 generates a mapping function that comprises the mapping model 170. The input to the mapping function is a value obtained from the authoritative function, and the output of the mapping function is a value that represents the new behavior.

Subsequently, the model generator 150 composes the mapping function with the authoritative function to construct a new function that comprises the new model 180. More specifically, the model generator 150 performs a function composition operation as follows:

$$b(y)=m \circ a(y)=m(a(y)) \qquad (1)$$

where "y" are values of the variable system parameters, "a" is the authoritative model 130, "m" is the mapping model 170, and "b" is the new model 180. The inputs to the new model 180 are the values of the variable system parameters, and the output of the new model 180 is a value that represents the new behavior.

In alternate embodiments, the mapping generator 160 may construct any type of mapping model 170 in any technically feasible fashion that is consistent with the authoritative model 130. Further, the model generator 150 may generate the new model 180 in any technically feasible fashion that is consistent with the mapping model 170 and the authoritative model 130. For instance, in some embodiments, the outputs of the authoritative model 130 and the new model 180 may be values for vectors that predict multiple behaviors. In other embodiments, the authoritative model 130 comprises discrete values instead of a mathematical function, and the functionality of the mapping generator 160 and the model generator 150 are modified accordingly. In yet other embodiments, the modeling subsystem 120 may include multiple authoritative models 130. In such embodiments, the mapping generator 160 may construct multiple mapping models 170, and the mapping generator 150 may generate the new model 180 based on any combination of the mapping models 170 and the authoritative models 130.

Advantageously, the complexity of the mapping model 170 reflects differences between the new behavior and the authoritative behavior across the variable system parameters. By contrast, the complexity of a model that directly models new behavior via conventional modeling techniques reflects the complexity of the new behavior. Consequently, the authoritative model 130 enables the model generator 150 to optimize a rate of accuracy improvement experienced while generating the new model 180. In operation, the rate of accuracy improvement experienced while generating the new model 180 typically correlates to an amount of structural similarity between the authoritative behavior and the new behavior across the variable system parameters.

For instance, in some embodiments, the authoritative model 130 may represent a page access latency of a database engine for a storage cache of 128 MB and values of a database buffer pool that vary between 32 MB and 256 MB. The model generator 150 may be configured to generate the new model 180 that computes a page access latency of the database engine for a storage cache of 384 MB and values of the database buffer pool that vary between 32 MB and 256 MB. Empirical data shows that, across the variable system parameters, there is a large amount of structural similarity between the authoritative behavior (i.e., storage cache equals 128 MB) and the new behavior (i.e., storage cache equals 384 MB) of the database engine. Consequently, for a given sampling budget, the accuracy of the new model 180 exceeds the accuracy of a model of the new behavior that is generated based on conventional modeling technique.

Note that the techniques described herein are illustrative rather than restrictive, and may be altered without departing from the broader spirit and scope of the invention. Many modifications and variations on the functionality provided by the modeling subsystem 120, the model generator 150, and the mapping generator 160 will be apparent to those of ordinary skill in the art without departing from the scope and spirit of the described embodiments. For instance, in various embodiments, any number of the techniques may be implemented while other techniques may be omitted in any technically feasible fashion that generates a new model 180 based on a mapping model 170.

The model generator 150 may obtain the authoritative model 130, authoritative values from the authoritative model 130, and the new measured data 140 in any technically feasible fashion. For example, in some embodiments, the model generator 150 may identify the authoritative model 130 based on input data and then compute the authoritative values based on the authoritative model 130. In some embodiments, the modeling subsystem 120, the model generator 150, and/or the mapping generator 160 may select the authoritative model 130 from a database of existing models based on any number and type of relevant criteria (e.g., structural similarity, etc.). In various embodiments, the model generator 150 may request the new measured data 140 for any number of locations, and receive the new measured data 140 via user input. In other embodiments, the model generator 150 may execute any number of application programs to generate the new measured values 140.

In alternate embodiments, if a span of the variable system parameters predicted by the authoritative model 130 does not fully encompass the span of the variable system parameters for the new model 180, then the model generator 150 and/or the mapping generator 160 may supplement the authoritative model 130. For example, the model generator 150 and/or the mapping generator 160 could measure the authoritative behavior at additional locations to generate additional authoritative values. In another example, the mapping generator 160 could generate a preliminary mapping model based on the authoritative model 130. The model generator 150 could construct an inverse of the preliminary mapping model, and then generate additional authoritative values at additional locations based on the inverse of the preliminary mapping model. Finally, the mapping generator 160 could construct the mapping model 170 based on the authoritative values obtained from the authoritative model as well as the additional authoritative values.

The modeling subsystem 120 may be configured to generate any number and types of the new models 180. For example, in various embodiments, the modeling subsystem 120 may generate the new model 180 for a behavior of a computer system, a database system, or a design optimization system, to name a few. Notably, in some embodiments, the modeling subsystem 120 may generate the new model 180 that facilitates hyperparameter search for the optimal selection of optimization algorithms and optimization parameters.

In alternate embodiments, the system memory 174 may not include the modeling subsystem 120. Further, the modeling subsystem 120 may not include the authoritative model 130 and/or the new measured data 140. In some embodiments, any number of the modeling subsystem 120, the authoritative model 130, and the new measured data 140 may be stored on computer readable media such as a CD-ROM, DVD-ROM, flash memory module, or other tangible storage media. Further, in some embodiments, the model generator 150 and/or the mapping generator 160 may be provided as an application program (or programs) stored on computer readable media such as a CD-ROM, DVD-ROM, flash memory module, or other tangible storage media. In various embodiments, the functionality of the model generator 150 is integrated into or distributed across any number (including one) of software applications.

The components illustrated in the computer system 100 may be included in any type of computer system 100, e.g., desktop computers, server computers, laptop computers, tablet computers, and the like. Additionally, the model generator 150 may execute on distributed systems communicating over computer networks including local area networks or large, wide area networks, such as the Internet. The model generator 150 described herein is not limited to any particular computing system and may be adapted to take advantage of new computing systems as they become available. In alternate embodiments, the functionality of the modeling subsystem 120 and/or the model generator 150 may be implemented and provided in any technically feasible. For instance, in some embodiments the functionality of the modeling subsystem 120, the model generator 150, and/or the mapping generator 160 may be provided as a cloud-based service.

Generating a Mapping Model

Figure 2:
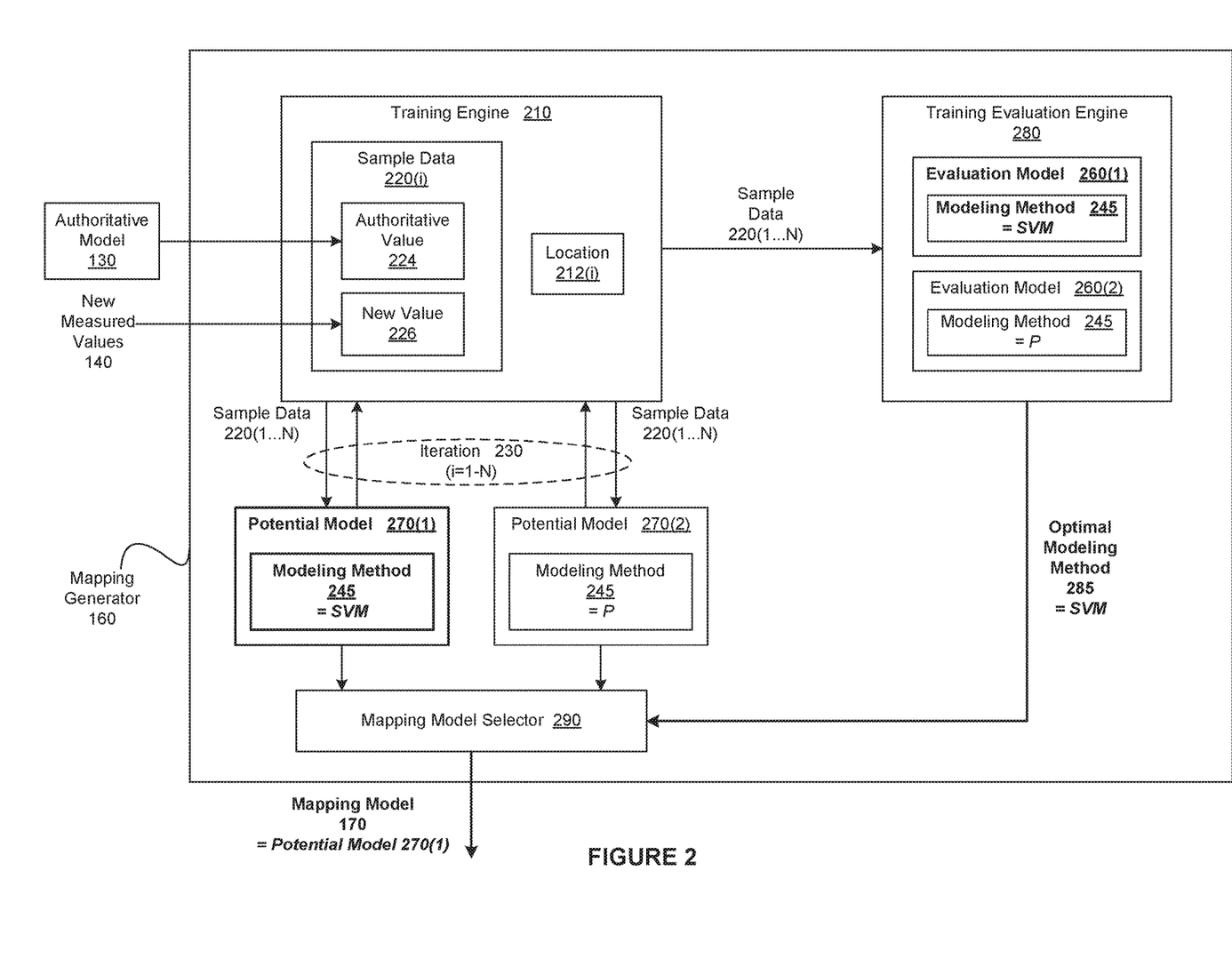
FIG. 2 is a more detailed illustration of the mapping generator of FIG. 1, according to various embodiments of the present invention.

FIG. 2 is a more detailed illustration of the mapping generator 160 of FIG. 1, according to various embodiments of the present invention. As shown, the mapping generator 160 includes, without limitation, a training engine 210, potential models 270, evaluation models 260, a training evaluation engine 280, and a mapping model selector 290.

For any number of modeling methods 245, the training engine 210 generates an untrained potential model 270 and an untrained evaluation model 260. Each of the modeling methods 245 represents a different machine learning technique. For example, the modeling methods 245 may include a support vector machine (SVM), a Gaussian process (GP), a polynomial (P) regression, a piecewise linear regression, and so forth. Both the total number of the potential models 270 and the total number of the evaluation models 260 are equal to the total number of the modeling methods 245.

For explanatory purposes only, the training engine 210 is configured to implement the two modeling methods 245 "SVM" and "polynomial regression (P)." Consequently, the mapping generator 160 generates the potential model 270(1) and the evaluation model 260(1) that implement the modeling method 245 "SVM" in addition to the potential model 270(2) and the evaluation model 260(2) that implement the modeling method 245 "polynomial regression." In alternate embodiments, the mapping generator 160 may implement any number of modeling methods 245 (including 1) and a corresponding number of potential models 270 and evaluation models 260.

Subsequently, in an iterative process, the training engine 210 generates sample data 220 at different locations 212, trains the potential models 270 based on the sample data 220, and performs training and/or evaluation operations on the evaluation models 260 based on the sample data 220. For an iteration 230 "i," the sample data 220(i) associated with a given location 212(i) includes an authoritative value 224 at the location 212(i) and a new value 226 at the location 212(i). The training engine 210 determines the authoritative value 224 based on the authoritative model 130 and the new value 226 based on the new measured values 140. The training engine 210 may determine when to cease iterating in any technically feasible fashion. For example, the training engine 210 could cease iterating when a predetermined time budget for sampling operations is exceeded.

For the iteration 230 "i," the training engine 210 selects the location 212(i) in any technically feasible fashion. In some embodiments, for the first iteration 230, the training engine 210 may set the location 212(1) equal to a combination of values for the variable system parameters that represents an extreme. For example, suppose the authoritative model 130 predicts the authoritative behavior based on a single variable system parameter that varies between 32 MB and 256 MB. In such a scenario, the training engine 210 could select the location 212(1) as the single variable system parameter value of 32 MB or 256 MB.

In various embodiments, the training engine 210 may select the location 212(i) based on the previously selected locations 212(1) through 212(i-1) and/or one or more of the partially trained potential models 260. For example, if the modeling methods 245 include "GP," then the training engine 210 could select the location 212(i) based on the partially trained potential model 260 that implements the modeling method 245 "GP." As persons skilled in the art will recognize, the partially trained potential model 260 that implements the modeling method 245 "GP" provides an estimate of a model uncertainty based on a location. Accordingly, the training engine 210 could set the location 212(i) equal to the location that is associated with the maximum model uncertainty.

In another example, if the modeling methods 245 include "SVM," then the training engine 210 could set the location 212(i) based on the locations 212(1) through 212(i-1). More specifically, the training engine 210 could select the location 212(i) that results in a randomly uniform distribution of the locations 212(1) through 212(i). As a general matter, the training engine 210 may be configured to exploit any properties of the previously selected locations 212 and/or the modeling methods 245 to optimize the selection of each of the locations 212.

After selecting the location 212(i), the training engine 210 generates the sample data 220(i) that is associated with the location 212(i). More precisely, the training engine 210 computes the authoritative value 224 based on the authoritative model 130, and determines the new value 226 based on the new measured values 140. The training engine 210 may determine the authoritative value 224 and the new value 226 in any technically feasible fashion. For example, the training engine 210 could set the input variable system parameters of an authoritative function that comprises the authoritative model 130 to reflect the location 212(i), and then compute an output of the authoritative function. The training engine 210 could then set the authoritative value 224 included in the sample data 220(i) to the computed output. Further, the training engine 210 could execute a query on a database to determine the new measured value 140(i) for the location 212(i). The training engine 210 could then set the new value 226 included in the sample data 220(i) to the new measured value 140(i).

After generating the sample data 220(i), the training engine 210 performs training operations on each of the potential models 250 based on the sample data 220(i). In general, the training engine 210 trains each of the potential models 250 to map from the authoritative values 224 to the corresponding new values 226 based on all the sample data 220. By contrast, the training evaluation engine 280 performs training and/or evaluation operations on each the evaluation models 260 based on the sample data 220(i). As persons skilled in the art will recognize, as part executing the validation techniques, the training evaluation engine 280 may train the evaluation models 260 based on subsets of the sample data 220.

More specifically, for each of the modeling methods 245, the training evaluation engine 280 uses l-norm criterion on the evaluation models 260 to determine a convergence of the modeling method 245 to the new measured values 140 as new sample data 220 are generated. In addition, for each of the modeling methods 245, the training evaluation engine 280 performs k-fold cross validation technique on the evaluation models 260 to determine accuracy of the corresponding evaluation model 260 to the new measured values 140. In alternate embodiments, the training evaluation engine 280 may implement any number of training and validation techniques while the training engine 210 is generating the sample data 220, after the training engine 210 finishes generating the sample data 220, or any combination thereof.

Notably, while the sample data 220(i) is generated based on the location 212(i), the sample data 220(i) does not include the location 212(i). Accordingly, the training engine 220 trains the potential models 270 and the evaluation models 260 to map from the authoritative values 224 to the corresponding new values 226 independently of the locations 212. Further, the training engine 210 may train the potential models 270 and/or the evaluation models 260 independently and substantially in parallel.

After the training engine 210 trains the potential models 270 and the training evaluation engine 280 trains and evaluates the evaluation models 260, the training evaluation engine 280 select an optimal modeling method 285 based on the evaluation models 260. More precisely, the training evaluation engine 280 selects the evaluation model 260 that is associated with the highest accuracy. The training evaluation engine 280 may perform any number and type of comparison operations between the evaluation models 260 and/or evaluation data that is associated with the evaluation models 260 to select the evaluation model 260 that is associated with the highest accuracy.

The training evaluation engine 280 then sets the optimal modeling method 285 equal to the modeling method 245 implemented by the selected evaluation model 260. In alternate embodiments, the training evaluation engine 280 may perform any number of operations (e.g., computation, comparison, correlation, cross-correlation, etc.) in any combination to determine the optimal modeling method 285. For example, the training evaluation engine 280 could compute and compare errors between the evaluations models 260 to determine the optimal modeling method 285.

Subsequently, the mapping model selector 290 selects the potential model 270 that implements the modeling method 245 that is equal to the optimal modeling method 285. The mapping model selector 290 then sets the mapping model 170 equal to the selected potential model 270. In alternate embodiments, the training evaluation engine 280 and/or the mapping model selector 290 may select the mapping model 170 in any technically feasible fashion.

For explanatory purposes only, FIG. 2 depicts a scenario in which the training evaluation engine 280 determines that the accuracy of the evaluation model 260(1) is higher than the accuracy of the evaluation model 260(2). Accordingly, the training evaluation engine 280 sets the optimal modeling method 285 equal to the modeling method 245 "SVM" that is implemented by the evaluation model 260(1). The mapping model selector 290 then determines that the potential model 270(1) implements the optimal modeling method 245 "SVM," and sets the mapping model 170 equal to the potential model 270(1).

Many modifications and variations on the functionality provided by the mapping generator 160 will be apparent to those of ordinary skill in the art without departing from the scope and spirit of the described embodiments. For instance, in alternate embodiments that implement a single modeling method 245, the functionality of the mapping generator 160 may be simplified. More precisely, the mapping generator 160 may include the training engine 210 and a single potential model 270 that comprises the mapping model 170. Accordingly, the mapping generator 160 may omit the evaluation models 260, the training evaluation engine 280, the optimal modeling method 285, and the mapping model selector 290.

Figure 3:
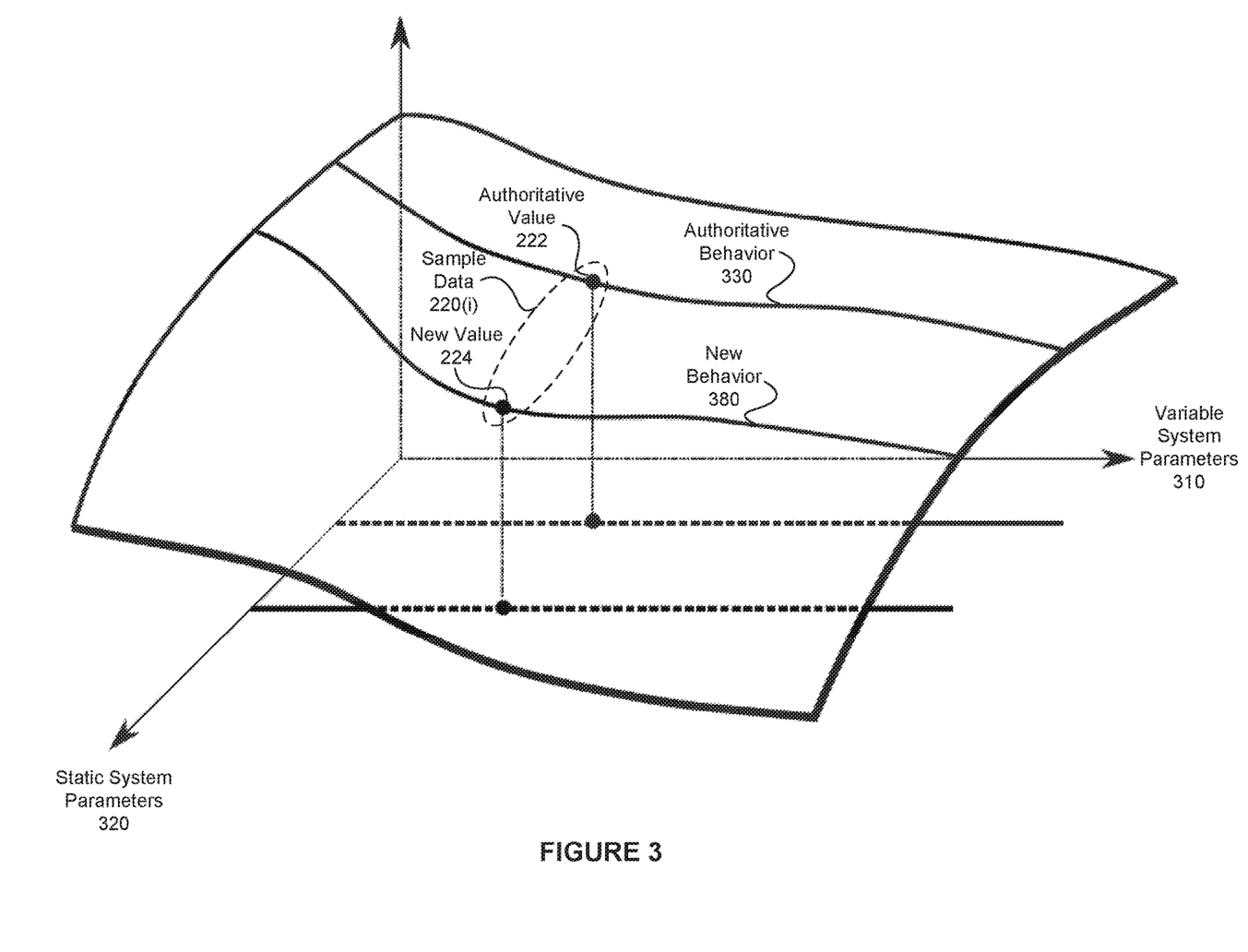
FIG. 3 illustrates an example of the sample data of FIG. 2, according to various embodiments of the present invention.

FIG. 3 illustrates an example of the sample data 220(i) of FIG. 2, according to various embodiments of the present invention. The context of FIG. 2 is that an authoritative behavior 330 depicts a behavior of a system for a previously modeled set of value(s) for static system parameter(s) 320 across a range of values for variable system parameter(s) 310. By contrast, a new behavior 380 depicts the behavior of the system for a new set of values for the static system parameter(s) 320 across the range of values for the variable system parameter(s) 310. In alternate embodiments, the authoritative behavior 330 and the new behavior 380 may be associated with different systems, different types of behavior, different types of static system parameter(s) 320, and/or different ranges of values for the variable system parameter(s) 310.

For instance, in some embodiments, the authoritative model 130 may represent a page access latency of a database engine for a storage cache of 128 MB and values of a database buffer pool that vary between 32 MB and 256 MB. The model generator 160 may be configured to generate the new model 180 that computes a page access latency of the database engine for a storage cache of 384 MB and values of the database buffer pool that vary between 32 MB and 256 MB. Accordingly, the static system parameter 320 comprises the storage cache, the previously modeled value of the storage cache is 128 MB, and the new value of the storage cache is 348 MB. The variable system parameter 310 comprises the database buffer pool, and the values for the database buffer pool vary between 32 MB and 256 MB.

The sample data 220(i) is associated with the location 212 along the axis that represents a particular set of values for the variable system parameters 310. The sample data 220(i) includes the authoritative value 222 and the new value 224. The authoritative value 222 is the value of the authoritative behavior 330 at the location 212. The new value 224 is the value of the new behavior 380 at the location 212. As shown, the new behavior 380 is structurally similar to the authoritative behavior 330. Consequently, the rate of accuracy improvement experienced while generating the new model 180 is greater than the rate of accuracy improvement that would be experienced were the new model to be generated based on conventional modeling techniques.

Generating a Model for the Behavior of Complex Systems

Figure 4:
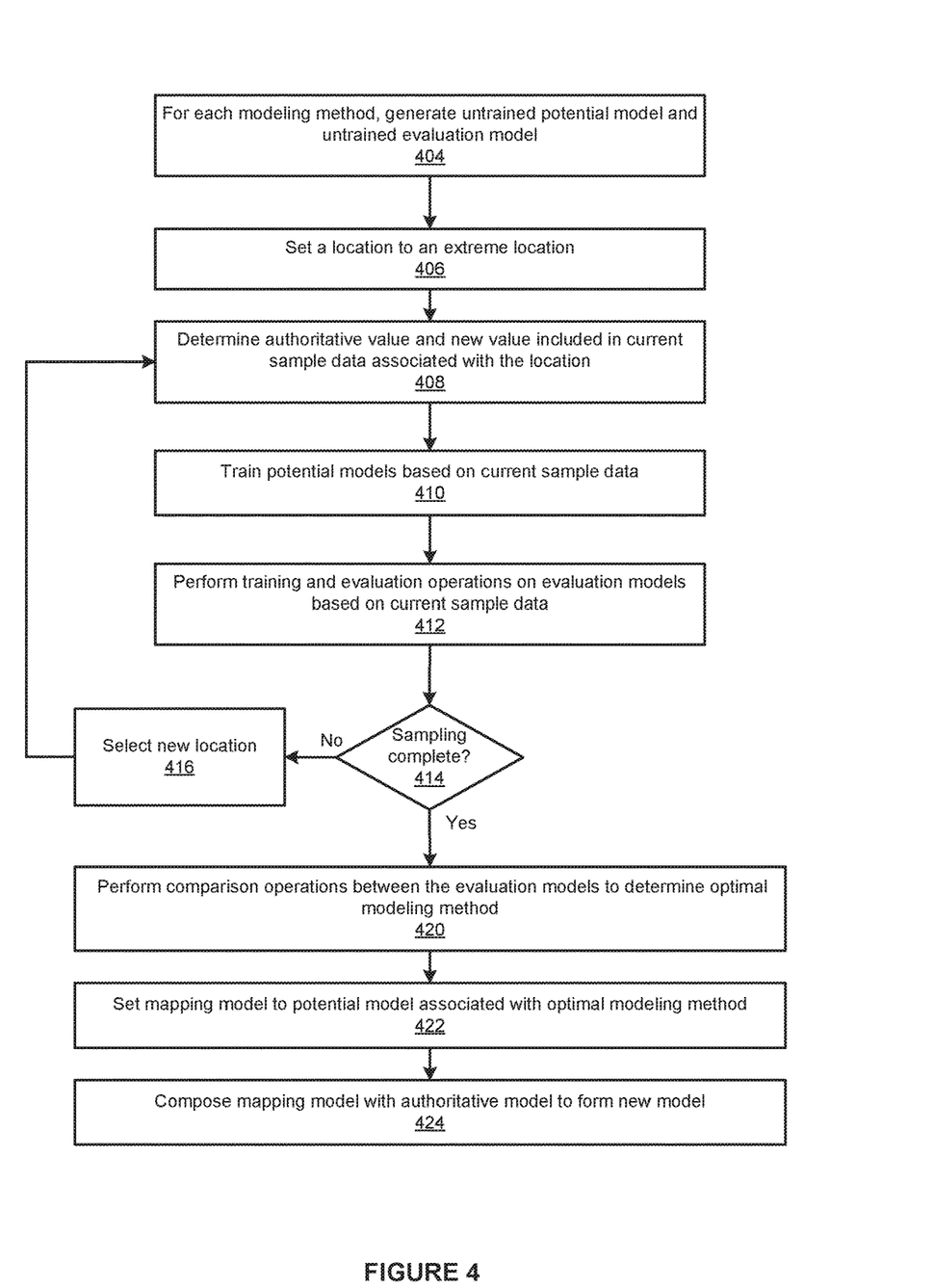
FIG. 4 is a flow diagram of method steps for generating a model for the behavior of a complex system, according to various embodiments of the present invention.

FIG. 4 is a flow diagram of method steps for generating a model for the behavior of a complex system, according to various embodiments of the present invention. Although the method steps are described with reference to the systems of FIGS. 1-3, persons skilled in the art will understand that any system configured to implement the method steps, in any order, falls within the scope of the present invention.

As shown, a method 400 begins at step 404, where, for each of the modeling methods 245, the training engine 210 generates the untrained potential model 270 and the untrained evaluation model 260. The training engine 210 may determine the number and types of the modeling methods 245 and generate the untrained potential models 270 and the untrained evaluation models 260 in any technically feasible fashion. At step 406, the training engine 210 sets the location 212 to a set of extreme values (e.g., maximums or minimums) for the variable system parameters 310. For example, suppose that the authoritative model 130 predicts the authoritative behavior based on a single variable system parameter that varies between 32 MB and 256 MB. In such a scenario, the training engine 210 could select the location 212(1) as the single variable system parameter value of 32 MB or 256 MB. In alternate embodiments, the training engine 210 may select the location 212 in any technically feasible fashion.

At step 408, the training engine 210 determines the "current" sample data 210 that is associated with the location 212. The training engine 210 generates the authoritative value 224 that is included in the current sample data 210 based on the authoritative model 130. The training engine 210 determines the new value 224 included in the current sample data 210 based on the new measured value 140 of the new behavior 380 at the location 212. The training engine 210 may obtain and/or compute the authoritative value 224 and the new measured value 140 in any technically feasible fashion. At step 410, the training engine 210 incrementally trains the potential models 270 based on the current sample data 210.

At step 412, the training evaluation engine 280 performs training and evaluation operations on the evaluation models 260 based on the current sample data 210. More specifically, for each of the modeling methods 245, the training evaluation engine 280 performs I-norm validation techniques on the evaluation models 260 to determine convergence of the modeling method 245 to the new measured values 140 as new sample data 220 are generated. In addition, for each of the modeling methods 245, the training evaluation engine 280 performs k-fold cross validation techniques on the evaluation models 260 to determine an accuracy of the corresponding evaluation model 260 to the new measured values 140. In alternate embodiments, the training evaluation engine 280 may implement any number of training and validation techniques while the training engine 210 is generating the sample data 220, after the training engine 210 finishes generating the sample data 220, or any combination thereof.

In this fashion, the training engine 210 incrementally trains the potential models 270 to map the authoritative behavior 330 to the new behavior 380 and the training evaluation engine 280 incrementally evaluates the training. As persons skilled in the art will recognize, since the sample data 210(i) does not include the location 212(i), the training is independent of the values of the variable system parameters 310. In various embodiments, the training engine 210 trains the potential models 270 and the training evaluation engine 280 performs training and evaluation operations on the evaluation models 260 substantially independently and substantially in parallel. For each of the modeling methods 245, the associated potential model 270 and the associated evaluation model 260 may execute any number and type of learning operations that are consistent with the modeling method 245.

At step 414, the training engine 210 determines whether the sampling operations are complete. The training engine 210 may determine whether the sampling operations are complete is any technically feasible fashion. For example, the training engine could determine whether a current runtime exceeds a predetermined maximum time specified in a sampling budget. If, at step 414, the training engine 210 determines that the sampling operations are not complete, then the method 400 proceeds to step 416. At step 416, the training engine 210 selects a new location 212. The training engine 210 may select the new location 210 in any technically feasible fashion based on any amount and type of data.

For example, if the modeling methods 245 include "GP," then the training engine 210 could select the location 212 based on the partially trained potential model 260 that implements the modeling method 245 "GP." As persons skilled in the art will recognize, the partially trained potential model 260 that implements the modeling method 245 "GP" provides an estimate of a model uncertainty based on location. Accordingly, the training engine 210 could set the location 212 to the location that is associated with the maximum model uncertainty. The method 400 then returns to step 408, where the training engine 210 generates the new sample 210 corresponding to the new location 212, and performs incremental training operations based on the new sample 210.

If, however, at step 414, the training engine 210 determines that the sampling operations are complete, then the method 400 proceeds directly to step 416. At step 416, the training evaluation engine 280 selects the optimal modeling method 285 based on the evaluation models 260. More precisely, the training evaluation engine 280 selects the evaluation model 260 that is associated with the highest accuracy. The training evaluation engine 280 may perform any number and type of comparison operations between the evaluation models 260 and/or evaluation data that is associated with the evaluation models 260 to select the evaluation model 260 that is associated with the highest accuracy. Finally, the training evaluation engine 280 sets the optimal modeling method 285 equal to the modeling method 245 implemented by the selected evaluation model 260. In alternate embodiments, the training evaluation engine 280 may perform any number of operations (e.g., computation, comparison, correlation, cross-correlation, etc.) in any combination to determine the optimal modeling method 285.

At step 422, the mapping model selector 290 selects the potential model 270 that implements the modeling method 245 that is equal to the optimal modeling method 285. The mapping model selector 290 then sets the mapping model 170 equal to the selected potential model 270. In alternate embodiments, the training evaluation engine 280 and/or the mapping model selector 290 may select the mapping model 170 in any technically feasible fashion.

At step 424, the model generator 150 composes the mapping model 170 with the authoritative model 130 to generate the new model 180. In this fashion, the model generator 150 indirectly transforms the authoritative model 130 to the new model 180 based on the new measured values 140. In alternate embodiments, the model generator 150 may generate the new model 180 in any technically feasible fashion that is consistent with the authoritative model 130 and the mapping model 170. The method 400 then terminates.

In sum, the disclosed techniques may be used to generate models for behaviors of systems that are not modeled based on existing, authoritative models and new measured data. In general, a mapping generator included in the model generator generates a mapping model between an authoritative model and new measured values. More specifically, the mapping generator trains a mapping model based on sample data associated with locations that specify different combinations of variable system parameters. For each location, the sample data includes an authoritative value obtained from the authoritative model and a new measured value that reflects the behavior of the system that is not modeled. The mapping generator then composes the mapping model with the authoritative model to generate the new model. In this fashion, the model generator indirectly transforms the authoritative model to the new model based on the new measured values.

Advantageously, the model generator improves a rate of accuracy improvement experienced while developing a new model for a "new behavior" compared to a rate of accuracy improvement that would be experienced were a conventional model for the new behavior to be generated based on conventional modeling techniques. In general, the increase in the rate of accuracy improvement correlates to a structural similarity between the authoritative behavior modeled by the authoritative model and the new behavior. More specifically, suppose that there was a significant amount of structural similarity between the authoritative behavior and the new behavior. Further suppose that, for a given sampling budget, the model generator was to generate a new model for the new behavior and a conventional model for the new behavior was to be generated based on conventional modeling techniques. Because of the structural similarity, the complexity of the mapping model would be significantly less than the complexity of the conventional model. Consequently, the accuracy of the mapping model would be significantly greater than the accuracy of the conventional model. Since the accuracy of the new model for the new behavior would correlate to the accuracy of the mapping model, the accuracy of the new model would also be significantly greater than the accuracy of the conventional model.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for generating a model for a behavior of a first system, the method comprising:
    generating a first sample data that includes: (1) a first authoritative value that is obtained from an authoritative model based on a first combination of system parameters and (2) a first measured value that represents a behavior of the first system at the first combination of system parameters, wherein the authoritative model comprises a pre-existing model that predicts a behavior of a second system, wherein the second system is different than the first system;
    training an untrained mapping model based on the first sample data to generate a first trained mapping model;
    training the first trained mapping model based on at least one other sample data to generate a second trained mapping model, wherein the second trained mapping model maps values that represent predicted behavior of the second system obtained from the authoritative model to values that represent a behavior of the first system at different combinations of system parameters; and
    modifying the authoritative model based on the second trained mapping model to generate the model for the behavior of the first system, wherein the model estimates the behavior of the first system for the different combinations of system parameters.

2. The computer-implemented method of claim 1, wherein the second trained mapping model implements a support vector machine, a Gaussian process, a polynomial regression, or a piecewise linear regression modeling method.

3. The computer-implemented method of claim 1, wherein the authoritative model comprises at least one of a function or a plurality of authoritative values.

4. The computer-implemented method of claim 1, wherein the second trained mapping model implements a first modeling method, and generating the model for the behavior of the first system comprises:
    computing a first accuracy that is associated with the first modeling method based on an evaluation model that implements the first modeling method;
    if the first accuracy is higher than a second accuracy that is associated with a second modeling method, then composing the second trained mapping model with the authoritative model, or
    if the first accuracy is not higher than the second accuracy, then composing a different trained mapping model that is associated with the second modeling method with the authoritative model.

5. The computer-implemented method of claim 4, wherein computing the first accuracy comprises performing k-fold cross validation operations on the evaluation model.

6. The computer-implemented method of claim 4, further comprising computing the second accuracy independently from computing the first accuracy.

7. The computer-implemented method of claim 1, further comprising selecting the authoritative model from a plurality of existing models based on a comparison between the authoritative model and the behavior of the first system.

8. The computer-implemented method of claim 1, wherein the first system comprises a computer system, a database system, or a design optimization system.

9. The computer-implemented method of claim 1, wherein training the first trained mapping model comprises:
    selecting a second combination of system parameters;
    generating a second sample data that includes a second authoritative value that is obtained from an authoritative model based on the second combination of system parameters and a second measured value that represents the behavior of the first system at the second combination of system parameters; and
    training the first trained mapping model based on the second sample data.

10. The computer-implemented method of claim 9, wherein selecting the second combination of system parameters comprises determining a combination of system parameters that corresponds to a maximum estimated uncertainty that is associated with the first trained mapping model.

11. One or more non-transitory computer-readable media including instructions that, when executed by one or more processing units, cause the one or more processing units to generate a model for a behavior of a first system by performing the steps of:
    generating a first sample data that includes: (1) a first authoritative value that is obtained from an authoritative model based on a first combination of system parameters and (2) a first measured value that represents a behavior of the first system at the first combination of system parameters, wherein the authoritative model comprises a pre-existing model that predicts a behavior of a second system, wherein the second system is different than the first system;
    training an untrained mapping model based on the first sample data to generate a first trained mapping model;
    training the first trained mapping model based on at least one other sample data to generate a second trained mapping model, wherein the second trained mapping model maps values that represent predicted behavior of the second system obtained from the authoritative model to values that represent a behavior of the first system at different combinations of system parameters; and
    modifying the authoritative model based on the second trained mapping model to generate the model for the behavior of the first system, wherein the model estimates the behavior of the first system for the different combinations of system parameters.

12. The one or more non-transitory computer-readable media of claim 11, wherein the second trained mapping model implements a support vector machine, a Gaussian process, a polynomial regression, or a piecewise linear regression modeling method.

13. The one or more non-transitory computer-readable media of claim 11, wherein the authoritative model comprises at least one of a function or a plurality of authoritative values.

14. The one or more non-transitory computer-readable media of claim 11, wherein the second trained mapping model implements a first modeling method, and generating the model for the behavior of the first system comprises:
computing a first accuracy that is associated with the first modeling method based on an evaluation model that implements the first modeling method;
if the first accuracy is higher than a second accuracy that is associated with a second modeling method, then composing the second trained mapping model with the authoritative model, or
if the first accuracy is not higher than the second accuracy, then composing a different trained mapping model that is associated with the second modeling method with the authoritative model.

15. The one or more non-transitory computer-readable media of claim 11, wherein generating the model for the behavior of the first system comprises composing the second trained mapping model with the authoritative model.

16. The one or more non-transitory computer-readable media of claim 11, wherein the authoritative model is associated with an authoritative behavior that is structurally similar to the behavior of the first system.

17. The one or more non-transitory computer-readable media of claim 11, wherein the first system comprises a computer system, a database system, or a design optimization system.

18. The one or more non-transitory computer-readable media of claim 11, wherein the first measured value comprises a scalar or a vector.

19. The one or more non-transitory computer-readable media of claim 11, wherein training the first trained mapping model comprises:
selecting a second combination of system parameters;
generating a second sample data that includes a second authoritative value that is obtained from an authoritative model based on the second combination of system parameters and a second measured value that represents the behavior of the first system at the second combination of system parameters; and
training the first trained mapping model based on the second sample data.

20. A system comprising:
a memory storing a model generator; and
a processor that is coupled to the memory and, when executing the model generator, is configured to:
generate a first sample data that includes: (1) a first authoritative value that is obtained from an authoritative model based on a first combination of system parameters and (2) a first measured value that represents a behavior of a first system at the first combination of system parameters, wherein the authoritative model comprises a pre-existing model that predicts a behavior of a second system, wherein the second system is different than the first system;
train an untrained mapping model based on the first sample data to generate a first trained mapping model;
train the first trained mapping model based on at least one other sample data to generate a second trained mapping model, wherein the second trained mapping model maps values that represent predicted behavior of the second system obtained from the authoritative model to values that represent a behavior of the first system at different combinations of system parameters; and
modify the authoritative model based on the second trained mapping model to generate a model for the behavior of the first system based on the second trained mapping model and the authoritative model, wherein the model estimates the behavior of the first system for the different combinations of system parameters.

* * * * *